United States Patent [19]
Tsuchida et al.

[11] Patent Number: 5,835,043
[45] Date of Patent: Nov. 10, 1998

[54] SIGNAL PROCESSING APPARATUS, SIGNAL RECORDING APPARATUS, AND SIGNAL REPRODUCING APPARATUS

[75] Inventors: Yuji Tsuchida, Tokyo; Ayataka Nishio, Kanagawa, both of Japan

[73] Assignee: Sony Corporation, Tokyo, Japan

[21] Appl. No.: 838,017

[22] Filed: Apr. 22, 1997

[30]     Foreign Application Priority Data

Apr. 24, 1996 [JP] Japan .................................. 8-102422

[51] Int. Cl.⁶ ....................................................... H05M 3/02
[52] U.S. Cl. ........................................... 341/143; 375/242
[58] Field of Search .................................. 341/110, 118, 341/143, 166

[56]         References Cited

U.S. PATENT DOCUMENTS

5,341,135  8/1994  Pearce ...................................... 341/120
5,512,898  4/1996  Norsworthy et al. .................... 341/155
5,561,424  10/1996  Norsworthy et al. .................... 341/126
5,568,142  10/1996  Velazquez et al. ...................... 341/126
5,585,802  12/1996  Cabler et al. ........................... 341/144

*Primary Examiner*—Marc S. Hoff
*Attorney, Agent, or Firm*—Jay H. Maioli

[57]                ABSTRACT

A signal processing circuit for equalizing includes circuitry for down-sampling an original signal of a one-bit digital signal having a sampling frequency fs (Hz) to a lower sampling frequency used for converting the signal into a multi-bit signal, extracting a given band from the multi-bit signal, equalizing the extracted band, over-sampling the equalized band through the effect of an interpolation filter for converting it to a multi-bit signal, and adding the over-sampled multi-bit signal to the original signal delayed by a given time.

7 Claims, 8 Drawing Sheets

SIGNAL PROCESSING APPARATUS, SIGNAL RECORDING APPARATUS, AND SIGNAL REPRODUCING APPARATUS

BACKGROUND OF THE INVENTION

1. Field of the Invention

The present invention relates to a signal processing apparatus for executing adjustment of sound quality such as equalizing with respect to a digital signal obtained through the effect of sigma-delta modulation, a signal recording apparatus for recording the digital signal processed through the sound quality adjustment, and a signal reproducing apparatus for executing adjustment of sound quality with respect to the digital signal processed through the sigma-delta modulation.

2. Description of the Prior Art

As a general method for digitizing an audio signal, there has been known a method for converting an analog audio signal into a multi-bit audio signal which has a sampling frequency of 44.1 KHz and a quantizing bit length of 16 bits.

On the other hand, in recent days, the improved method is executed to digitize an audio signal through the effect of a modulating system called sigma-delta (ΣΔ) modulation and transmit, record, and reproduce the digitized one-bit audio signal without being transformed.

The sigma-delta modulated one-bit audio signal has 64 times the sampling frequency of 44.1 KHz of the conventional multi-bit audio signal and as short a quantizing bit length as one bit. Hence, the one-bit audio signal is characteristic of a wide transmittable frequency band and a broad dynamic range.

It is natural that the aforementioned one-bit audio signal is required to execute a signal treatment such as equalizing for adjusting the sound quality.

Figure 12:
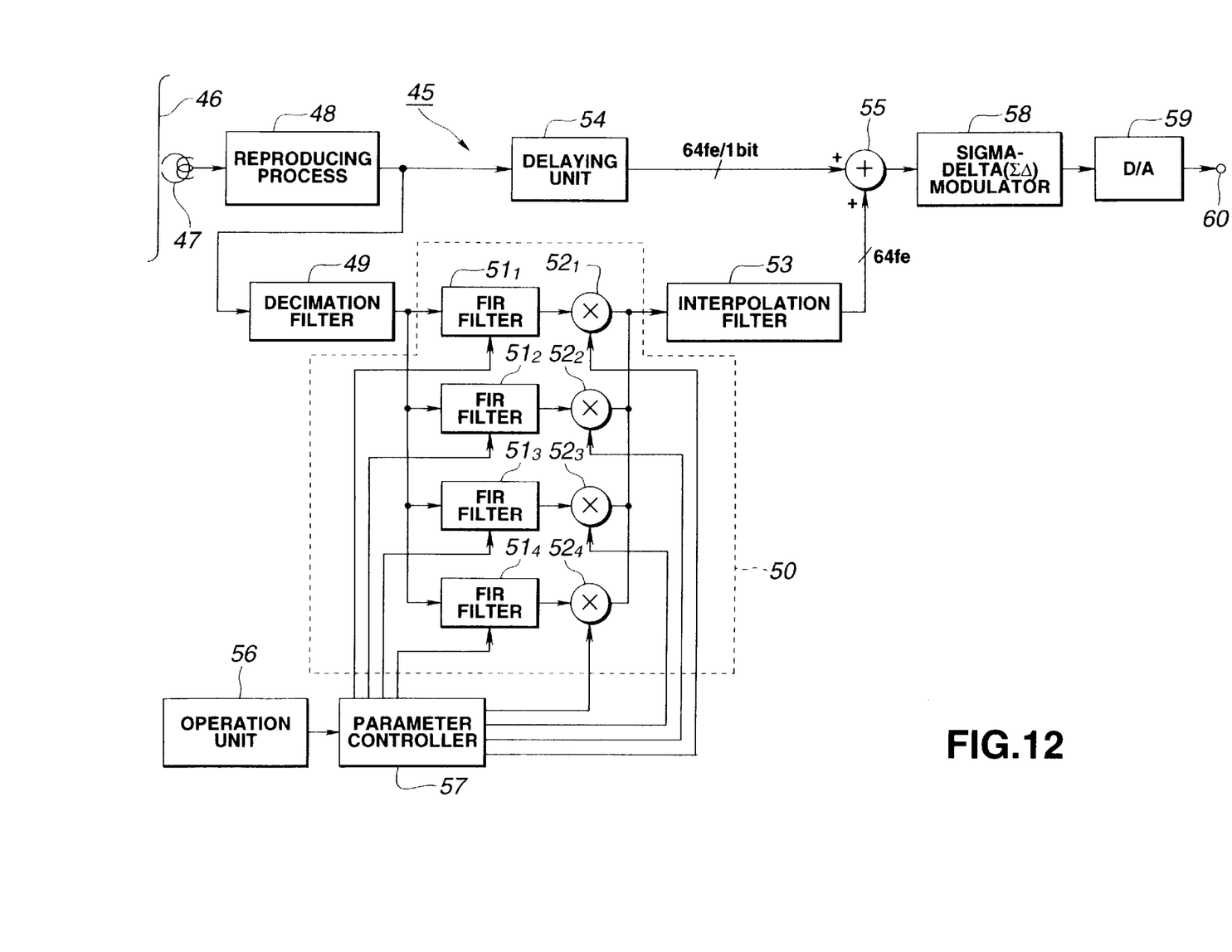
FIG. 12 is a block diagram showing a signal reproducing apparatus according to a third embodiment of the present invention.

For example, FIG. 12 shows the most fundamental arrangement of the signal processing apparatus for equalizing, that is, adjusting the sound quality by raising or lowering a gain of a specific band inside of the audible band.

Figure 1:
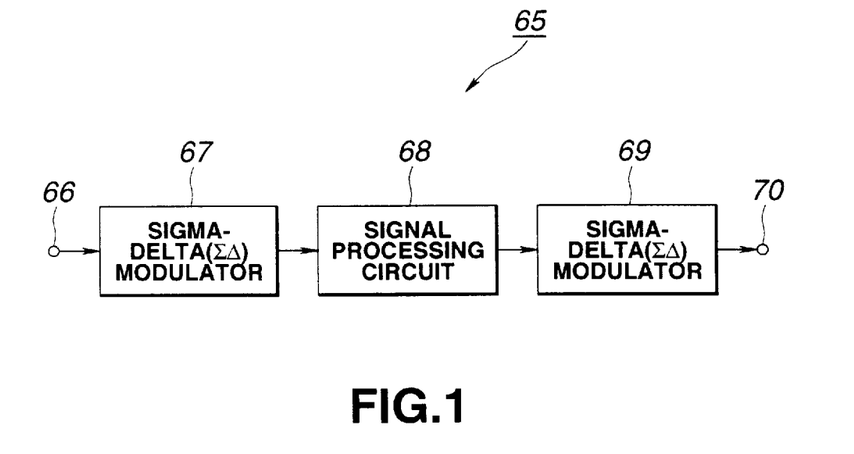
FIG. 1 is a block diagram showing a conventional signal processing device.

In the signal processing apparatus 65 shown in FIG. 1, an analog audio signal input at an input terminal 66 is supplied to a sigma-delta modulator 67. The sigma-delta modulator 67 operates to transform the input analog audio signal into a one-bit digital signal with 64 times the sampling frequency fe of 44.1 KHz used in the current compact disk, 64×fe.

The one-bit digital signal is supplied to a signal processing circuit 68 for PCM. The signal processing circuit 68 performs the adjustment of sound quality with respect to the one-bit digital signal.

The equalized signal from the signal processing circuit 68 is supplied to a sigma-delta modulator 69. The sigma-delta modulator 69 operates to transform the equalized signal into a one-bit digital signal again and then supply it to an output terminal 70.

The foregoing signal processing circuit 68 for PCM provides the sampling frequency of 64×fe with which the one-bit digital signal is derived. Hence, the circuit 68 is required to process the signal at 64 times the speed of the current sampling frequency. Further, in case that the signal processing circuit is composed of DSPs (Digital Signal Processors), lots of DSPs are required therefor. Since the frequency of the audio band is far lower than the sampling frequency 64×fe, the signal processing circuit is required to have a greater number of operating bits for obtaining the desired characteristic. This results in making the overall system larger in scale and cost.

The present invention is made in consideration of the foregoing conditions, and it is an object of the present invention to provide a signal processing apparatus, a signal recording apparatus, and a signal reproducing apparatus which are arranged to execute signal processing such as equalizing with small-scaled and inexpensive hardware.

SUMMARY OF THE INVENTION

In carrying out the object, according to a first aspect of the invention, a signal processing apparatus includes: a down-sampler for down-sampling an input signal having a sampling frequency fs; an extractor for extracting necessary band components from an output signal of the down-sampling unit; a signal processing unit for performing a predetermined signal treatment with respect to the necessary band components extracted by the extractor; an over-sampler for over-sampling an output signal from the signal processing unit and outputting a signal having the sampling frequency fs; a delaying unit for delaying the input signal having the sampling frequency fs by a total processing time of the down-sampler, the extractor, the signal processing unit, and the over-sampler; and an adder for adding the output signal of the delaying unit to the output signal of the over-sampler.

According to a second aspect of the invention, a signal recording apparatus includes: a down-sampler for down-sampling an input signal having a sampling frequency fs; an extractor for extracting necessary band components from an output signal from the down-sampler; a signal processing unit for performing a predetermined signal treatment with respect to the band components extracted by the extractor; an over-sampler for over-sampling an output signal from the signal processing unit and outputting a signal having the sampling frequency fs; a delaying unit for delaying the input signal having the sampling frequency fs by a total processing time of the down-sampler, the extractor, the signal processing unit, and the over-sampler; an adder for adding an output signal of the delaying unit to an output signal of the over-sampler; a sigma-delta modulator for sigma-delta modulating an output signal of the adder into a one-bit digital signal; and a recording processing unit for performing a recording treatment with respect to the one-bit digital signal from the sigma-delta modulator.

According to a third aspect of the invention, a signal reproducing apparatus includes: a down-sampler for down-sampling an input signal having a sampling frequency fs; an extractor for extracting necessary band components from an output signal from the down-sampler; a signal processing unit for performing a predetermined signal treatment with respect to the band components extracted by the extractor; an over-sampler for over-sampling an output signal from the signal processing unit and outputting a signal having the sampling frequency fs; a delaying unit for delaying the input signal having the sampling frequency fs by a total processing time of the down-sampler, the extractor, the signal processing unit, and the over-sampler; an adder for adding the output signal of the delaying unit to an output signal of the over-sampler; a sigma-delta modulator for sigma-delta modulating an output signal of the adder into a one-bit digital signal; and a converter for converting the one-bit digital signal from the sigma-delta modulator into an analog signal.

DESCRIPTION OF THE PREFERRED EMBODIMENTS

Hereafter, the description will be oriented to a signal processing apparatus, a signal recording apparatus, and a signal reproducing apparatus according to embodiments of the present invention.

Figure 2:
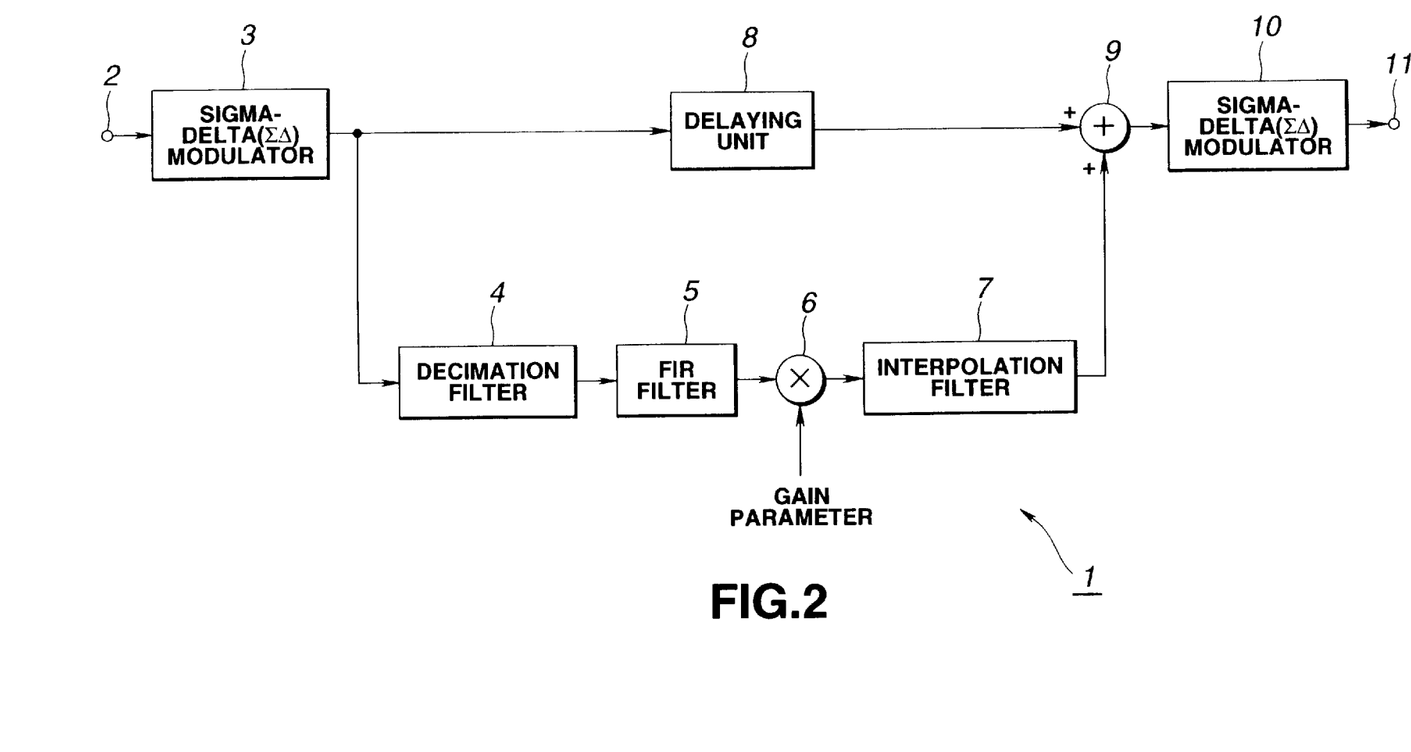
FIG. 2 is a block diagram showing a signal processing apparatus according to a first embodiment of the present invention.

At first, a first embodiment of the invention will be described with reference to FIG. 2. The first embodiment concerns a signal processing apparatus 1 which executes adjustment of sound quality such as equalizing with respect to a one-bit digital signal obtained through the effect of the sigma-delta modulation.

The one-bit digital signal is generated by using a sampling frequency fs that is 64 times as high as a sampling frequency fe (=44.1 KHz) used in a normal compact disk.

This signal processing apparatus 1 is arranged to have an input terminal 2, a sigma-delta modulator 3, a decimation filter 4, a FIR (Finite Impulse Response) filter 5, a multiplier 6, an interpolation filter 7, a delaying unit 8, an adder 9, a sigma-delta modulator 10, and an output terminal 11. The sigma-delta modulator 3 operates to sigma-delta modulate an analog audio signal applied at the input terminal 2 into a one-bit digital signal whose sampling frequency is fs. The decimation filter 4 operates to down-sample the one-bit digital signal. The FIR filter 5 operates to extract the necessary band components from the output signal of the decimation filter 4. The multiplier 6 operates to multiply the band components extracted by the FIR filter 5 by the gain parameter for attenuating or intensifying the band components. The interpolation filter 7 operates to over-sample the output signal of the multiplier 6 and then output the signal of the sampling frequency fs. The delaying unit 8 operates to give to the one-bit digital signal of the sampling frequency fs output from the sigma-delta modulator 3 the delaying time corresponding to the total processing time consumed by the decimation filter 4, the FIR filter 5, the multiplier 6, and the interpolation filter 7. The adder 9 operates to add the output signal of the delaying unit 8 to the output signal of the interpolation filter 7. The sigma-delta modulator 10 operates to sigma-delta modulate the output signal of the adder 9 into a one-bit digital signal and then output the one-bit digital signal at the output terminal 11.

In general, the equalizing process is mainly intended for adjusting the sound quality. Hence, the equalizing process just needs to handle the audible frequency band but does not need to handle the higher band than the audible frequency band from a practical point of view. It means that practically a sampling frequency needed handling the components of the audible frequency band is just required for the operation.

Hence, the one-bit digital signal whose sampling frequency is 64×fe is down-converted to such a minimum level as processing the audible band before processing the signal. This down-conversion allows the equalizing process to execute the essential purpose and reduce the amount of necessary hardware.

However, in a case that the one-bit digital signal, that is, an original signal is down-converted from fs to fe before doing the equalizing process, the information outside of the audible band is deleted though the amount of operation served as load is reduced. This deletion results in eliminating the advantages entailed by the quickly sampled one-bit digital signal.

In the signal processing apparatus 1 according to the first embodiment, the one-bit digital signal from the sigma-delta modulator 3 is supplied to two systems. In one system, the one-bit digital signal whose sampling frequency is 64×fe is down-converted to such a minimum level as enabling to process the audible band components. Then, only the desired band is extracted from the one-bit digital signal. The extracted band is equalized and then the sampling frequency of the band is enhanced to 64×fe. In the other system, the equalized signal is added to the information outside of the audible band given a predetermined delaying time.

The sigma-delta modulator 3 operates to sigma-delta modulate the analog audio signal applied at the input terminal 2 into a one-bit digital signal whose sampling frequency is fs (=64×fe) and then output the one-bit digital signal.

Figure 3:
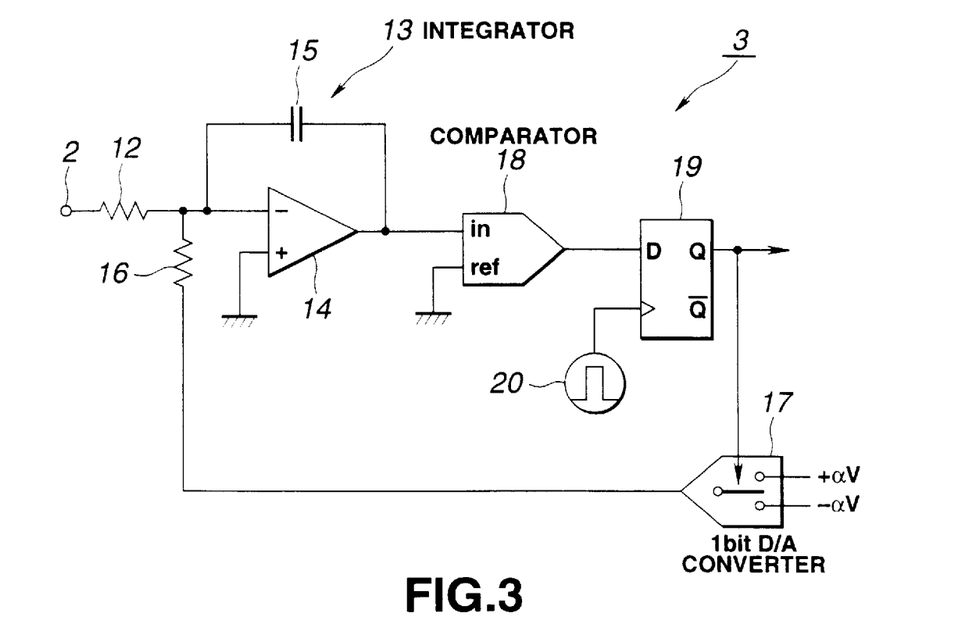
FIG. 3 is a circuit diagram showing a sigma-delta modulator used in the signal processing apparatus according to the first embodiment of the invention.

The concrete arrangement of the sigma-delta modulator 3 is shown in FIG. 3. The analog signal input at the input terminal 2 is applied to an inverted input terminal (−) of an operational amplifier 14 through a resistor 12. The output of a one-bit D/A converter 17 is applied to an inverted input terminal (−) of the operational amplifier 14 through a resistor 16.

A capacitor 15 is inserted between the inverted input terminal (−) and the output terminal of the operational amplifier 14. The capacitor 15 and the operational amplifier 14 compose an inversion type integrator 13 so that the operational amplifier 14 outputs a voltage derived by integrating a difference current between the input signal and the feedback one-bit signal and then applies the voltage into a comparator 18.

When the output of the operational amplifier 14 is 0 V or higher, the comparator 18 operates to output a value of "1"

to a D latch 19. When the output of the operational amplifier 14 is lower than 0 V, the comparator 18 operates to output a value of "0" to the D latch 19.

The D latch 19 operates to latch the output of the comparator 18 at each sampling period by using a sampling clock supplied from a clock terminal 20 and then output the resulting one-bit sigma-delta modulated signal. The D latch 19 operates to supply the control output for the output of the one-bit D/A converter 17.

When the output of the D latch 19 is a value of "1", the one-bit D/A converter 17 operates to output "+αV". When the output of the D latch 19 is a value of "0", the one-bit D/A converter 17 operates to output "+αV". The converter 17 adds each output to an input analog audio signal supplied through the resistor 12.

Figure 4:
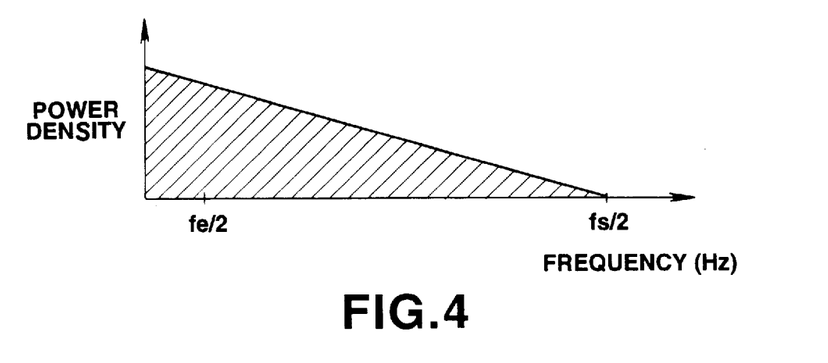
FIG. 4 is a characteristic graph showing a power density spectrum characteristic of a one-bit digital signal output from the sigma-delta modulator shown in FIG. 3.

FIG. 4 shows a power density spectrum characteristic of a one-bit digital signal output from the sigma-delta modulator 3. This one-bit digital signal is supplied to the decimation filter 4 and the delaying unit 8.

Figure 5:
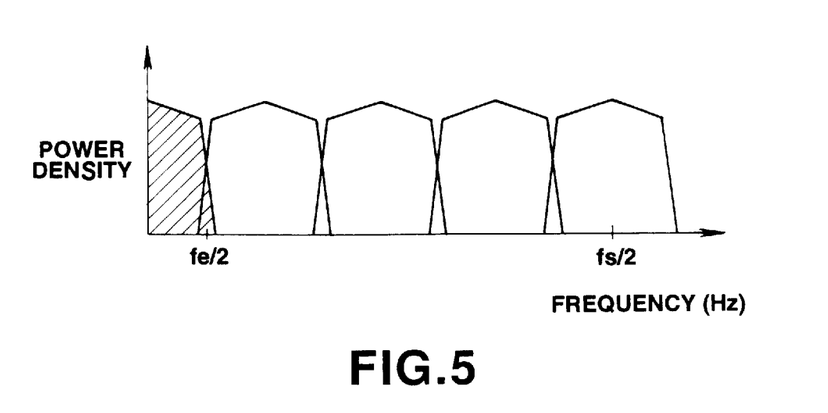
FIG. 5 is a characteristic graph showing a power density spectrum of a multi-bit signal output from a decimation filter used in the first embodiment of the present invention.

The decimation filter 4 operates to down-sample the one-bit digital signal whose sampling frequency is fs (=64× fe) and then output a multi-bit signal whose sampling frequency is fe as shown in FIG. 5.

The FIR filter 5 operates to extract the band to be equalized from the multi-bit signal with the sampling frequency fe. Herein, the FIR filter 5 uses a linear phase FIR filter. In place, the FIR filter 5 may be an IIR (Infinite Impulse Response) filter designed in the consideration of the effect of phase rotation on the overall system. The power density spectrum of the band to be equalized, which is output from the FIR filter 5, is shown in FIG. 6.

Figure 6:
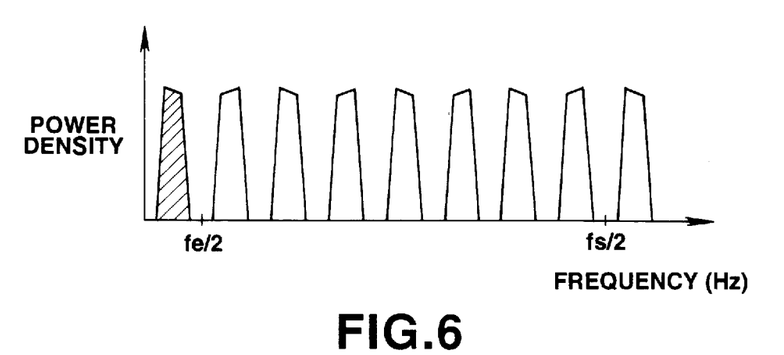
FIG. 6 is a characteristic graph showing a power density spectrum of a band to be equalized, output from a FIR filter used in the first embodiment of the present invention.

The multiplier 6 operates to multiply the signal of the band having the power density spectrum as shown in FIG. 6 by the gain parameter for attenuating or intensifying the signal. For example, if the gain parameter is multiplied by the signal for attenuating the signal, the output signal has the power density spectrum as shown in FIG. 7.

Figure 7:
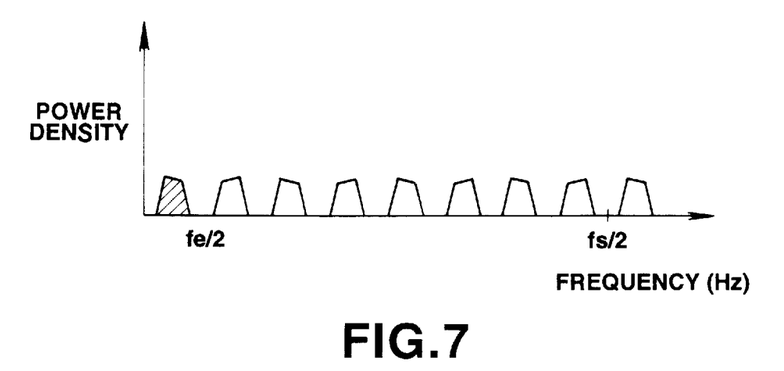
FIG. 7 is a characteristic graph showing a power density spectrum of an attenuated output supplied by a multiplier used in the first embodiment of the present invention.
Figure 8:
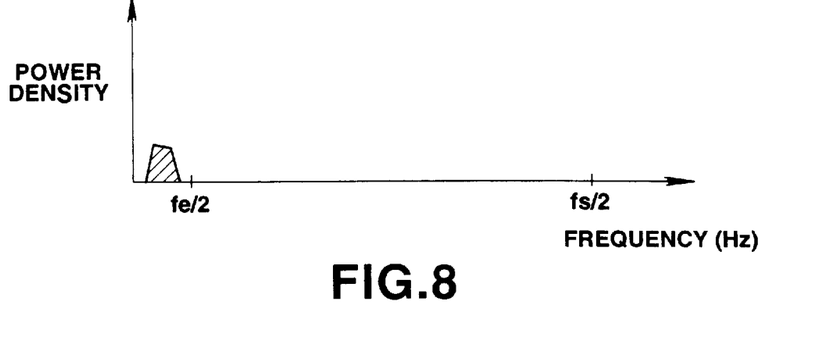
FIG. 8 is a characteristic graph showing a power density spectrum of a multi-bit signal output from an interpolation filter used in the first embodiment of the present invention.

The interpolation filter 7 operates to over-sample the signal having the power density spectrum as shown in FIG. 7 and then output a multi-bit signal whose sampling frequency is fs (=64×fe) as shown in FIG. 8.

On the other hand, the one-bit digital signal supplied to the delaying unit 8 is delayed by the time consumed by the decimation filter 4, the FIR filter 5, the multiplier 6, and the interpolation filter 7.

Figure 9:
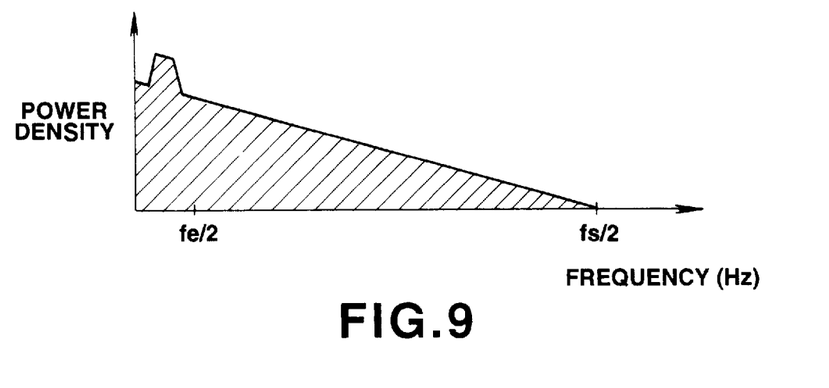
FIG. 9 is a characteristic graph showing a power density spectrum of an added output of an adder when a gain parameter given to the multiplier is positive in the first embodiment of the present invention.
Figure 10:
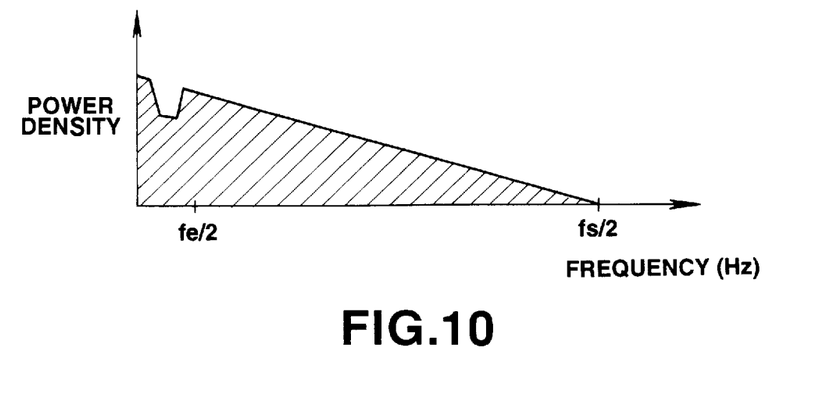
FIG. 10 is a characteristic graph showing a power density spectrum of an added output of the adder when a gain parameter given to the multiplier is negative in the first embodiment of the present invention.

The delayed output of the delaying unit 8 and the output of the interpolation filter 7 are supplied to the adder 9 in which both of the outputs are added. When the gain parameter supplied to the multiplier 6 is positive, the equalizing process is executed to intensify a specific frequency band as shown in FIG. 9, while when the gain parameter is negative, the equalizing process is executed to attenuate the specific frequency band as shown in FIG. 10.

The output of the adder 9 is supplied to the sigma-delta modulator 10. The sigma-delta modulator 10 operates to sigma-delta modulate the multi-bit signal whose sampling frequency is fs (=64×fe), that is, the added output of the adder, into a one-bit digital signal.

In the operation of the signal processing apparatus 1, the decimation filter 4 operates to down-sample the one-bit digital signal with the sampling frequency 64×fe into a multi-bit signal with the sampling frequency fe. Then, the FIR filter 5 operates to extract the band to be equalized from the multi-bit signal with the sampling frequency fe. Then, the multiplier 6 operates to multiply only this band by the gain parameter. Next, the interpolation filter 7 operates to over-sample the gain-multiplied signal and then supply it to the adder 9. The adder 9 operates to add the signal to the one-bit digital signal delayed by the delaying unit 8. As viewed from the output side of the adder 9, therefore, it looks like that the difference to be directly processed is added to the original one-bit digital signal.

As is understood from the above description, this signal processing apparatus 1 is arranged to equalize only the audible band of the one-bit digital signal obtained through the sigma-delta modulation. Hence, the apparatus may be reduced in hardware scale and inexpensively manufactured. That is, this signal processing apparatus 1 enables to equalize the one-bit digital signal without eliminating the information outside of the audible band though the apparatus is reduced in size.

Figure 11:
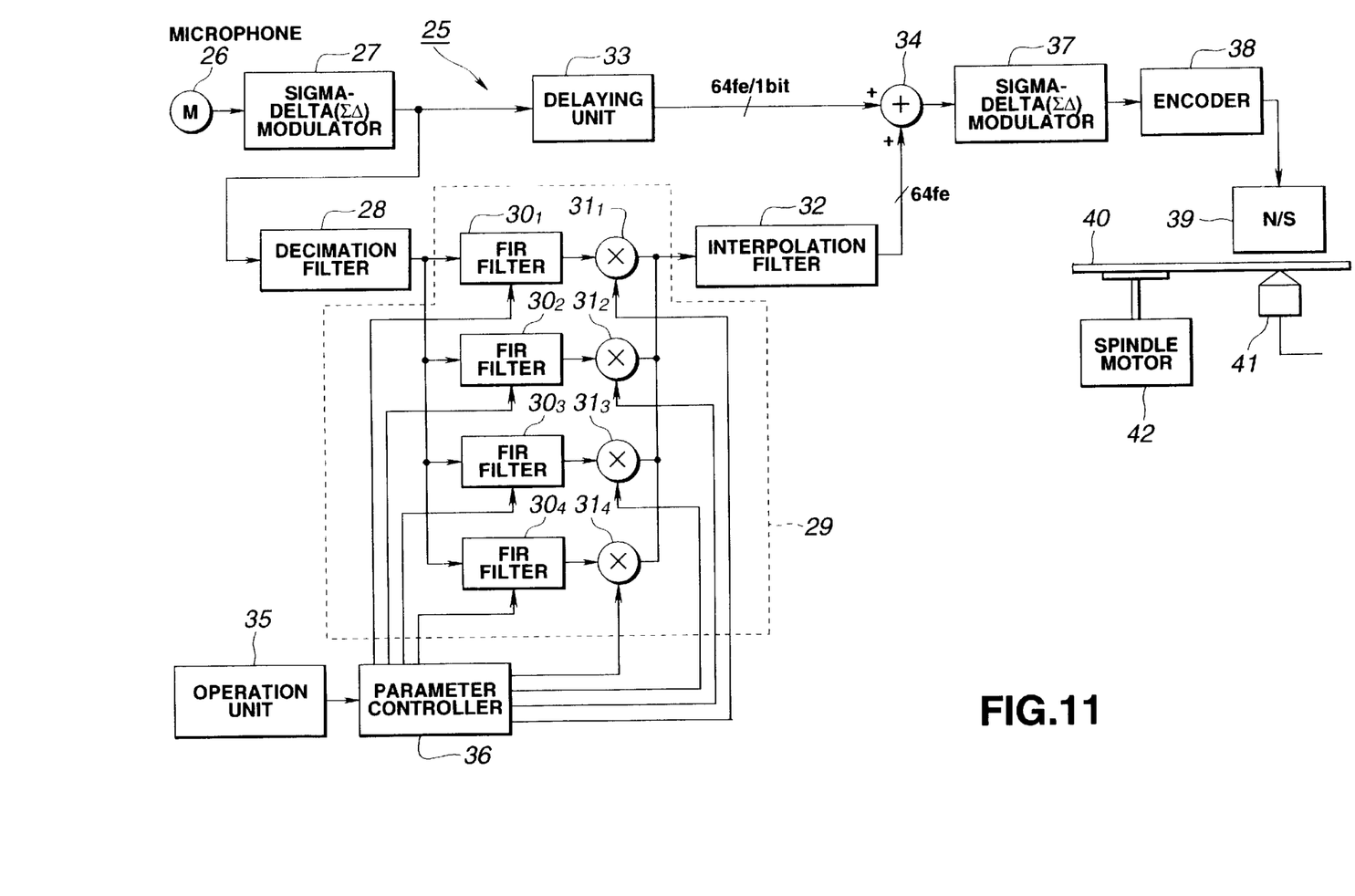
FIG. 11 is a block diagram showing a signal recording apparatus according to a second embodiment of the present invention.

Next, the description will be oriented to the second embodiment with reference to FIG. 11. This second embodiment concerns with a signal recording apparatus 25. In this signal recording apparatus 25, an analog audio signal is input at a microphone 26 and then is sigma-delta modulated into a one-bit digital signal. The four bands of the one-bit digital signal are equalized. Then, the resulting one-bit digital signal is recorded on a magneto-optical disk 40.

The one-bit digital signal treated herein is generated by using a sampling frequency fs that is 64 times the sampling frequency fe (=44.1 KHz) used in the compact disk.

This signal recording apparatus 25 is arranged to have a microphone 26, a sigma-delta modulator 27, a decimation filter 28, FIR filters $30_1$, $30_2$, $30_3$, $30_4$, four multipliers $31_1$, $31_2$, $31_3$, $31_4$, an interpolation filter 32, a delaying unit 33, an adder 34, a sigma-delta modulator 37, an encoder 38, a magnetic head 39, a magneto-optical disk 40, an optical head 41, and a spindle motor 42. In operation, an analog audio signal is input at the microphone 26 and then is sigma-delta modulated into a one-bit digital signal with the sampling frequency fs through the effect of the sigma-delta modulator 27. The decimation filter 28 operates to down-sample the one-bit digital signal with the sampling frequency fs. The output signal of the decimation filter 28 is sent to the FIR filters $30_1$, $30_2$, $30_3$ and $30_4$. The FIR filters $30_1$, $30_2$, $30_3$ and $30_4$ operate to extract four bands to be equalized from the output signal of the decimation filter 28. The four multipliers $31_1$, $31_2$, $31_3$ and $31_4$ operate to multiply the four bands extracted by the FIR filters $30_1$ to $30_4$ by the gain parameters for attenuating or intensifying the four bands. The interpolation filter 32 operates to over-sample the output signals of the four multipliers $31_1$ to $31_4$ and supply the one-bit digital signal with the sampling frequency fs. The delaying unit 33 operates to delay the one-bit digital signal supplied from the sigma-delta modulator 27 by the total processing time consumed by the decimation filter 28, the FIR filters $30_1$ to $30_4$, the multipliers $31_1$ to $31_4$, and the interpolation filter 32. The adder 34 operates to add the output signal of the delaying unit 33 to the output signal of the interpolation filter 32. The sigma-delta modulator 37 operates to sigma-delta modulate the output signal of the adder 34 into the one-bit digital signal having the sampling frequency fs. The encoder 38 operates to encode the one-bit digital signal from the sigma-delta modulator 37 for recording the signal. The magnetic field head 39 operates to alter the orientation of the magnetic field according to the coded output of the encoder 38, that is, the written data. The optical head 41 is located as opposed to the magnetic field head 39 with the magneto-optical disk 40 laid therebetween and outputs a laser beam for weakening the coercive force on the signal recording surface on the magneto-optical disk 40. The magneto-optical disk 40 is rotated by the spindle motor 42.

The FIR filters $30_1$ to $30_4$ and the multipliers $31_1$ to $31_4$ compose a digital signal processor (DSP) 29. The FIR filters $30_1$ to $30_4$ and the multipliers $31_1$ to $31_4$ located inside of the DSP 29 receive the gain parameters generated by a parameter controller 36 in accordance with the operation done by an operation unit 35 and the coefficients of the FIR filters.

That is, in case that the user inputs a frequency, a band width, and a gain to be equalized using the operation unit 35, the parameter controller 36 operates to generate the filtering coefficients of the FIR filters $30_1$ to $30_4$ and the gain parameters of the multipliers $31_1$ to $31_4$ and rewrite the coefficient memory inside of the DSP 29 for performing a filtering operation.

The output signal from the DSP 29 is over-sampled into a multi-bit signal with the sampling frequency fs (=64×fe) through the effect of the interpolation filter 32.

On the other hand, the one-bit digital signal supplied to the delaying unit 33 is applied into the delaying unit 33 in which the signal is delayed by a time consumed by the decimation filter 28, the FIR filters $30_1$ to $30_4$, the multipliers $31_1$ to $31_4$, and the interpolation filter 32.

The delayed output of the delaying unit 33 and the filtered output of the interpolation filter 32 are supplied to the adder 34 in which both of the outputs are added to each other.

The added output of the adder 34 is supplied to the sigma-delta modulator 37. The sigma-delta modulator 37 operates to sigma-delta modulate the multi-bit signal with the sampling frequency fs (=64×fe), that is, the added output into a one-bit digital signal.

The one-bit digital signal is encoded by the encoder 38 so that the signal is adapted to recording. Then, the encoded signal is supplied to the magnetic field head 39. Then, the magnetic field head 39 operates to alter the magnetizing direction of the signal recording layer of the magneto-optical disk 40 on which the recording laser beam is applied by the optical head 41.

This signal recording apparatus 25 is arranged so that the one-bit digital signal from the sigma-delta modulator 27 is supplied to two systems. In one system, the one-bit digital signal with the sampling frequency 64×fe is down-converted into such a minimum level as enabling to process the audible band components and then only the desired bands are extracted from the digital signal. The bands are equalized and then the sampling frequency is enhanced to 64×fe. Next, the resulting signal is supplied to the other system in which the signal is added to the information outside of the audible band delayed by a given time.

Hence, this signal recording apparatus 25 operates to perform an equalizing process with respect to only the audible bands of the one-bit digital signal obtained through the effect of the sigma-delta modulation. This makes it possible to reduce the hardware in scale and inexpensively manufacture the apparatus. That is, this signal recording apparatus 25 enables to record the equalized one-bit digital signal without losing the information outside of the audible band though the hardware of the apparatus is reduced in size.

In turn, the description will be oriented to a third embodiment of the present invention with reference to FIG. 12. This third embodiment concerns with a signal reproducing apparatus 45. The signal reproducing apparatus 45 operates to pick up a one-bit digital signal recorded on a magnetic tape 46, perform an equalizing process on the four bands of the one-bit digital signal, and transform the equalized signal into an analog audio signal.

The one-bit digital signal treated herein is generated by using the sampling frequency fs (=64×fe) that is 64 times the sampling frequency fe (=44.1 KHz) used in a normal compact disk, for example.

The one-bit digital signal recorded on the magnetic tape 46 after performing the recording process is picked up by a reproducing head 47. The one-bit digital signal is reproduced into a normal one-bit digital signal by a reproducing unit 48.

The signal reproducing apparatus 45 is arranged to have a decimation filter 49, four FIR filters $51_1, 51_2, 51_3, 51_4$, four multipliers $52_1, 52_2, 52_3, 52_4$, an interpolation filter 53, a delaying unit 54, an adder 55, a sigma-delta modulator 58, and a D/A converter 59.

In operation, the decimation filter 49 operates to down-sample the one-bit digital signal from the reproducing unit 48. The FIR filters $51_1$ to $51_4$ operate to extract four bands to be equalized from the output signal of the decimation filter 49. The four multipliers $52_1$ to $52_4$ operate to multiply the four bands extracted by the FIR filters $51_1$ to $51_4$ by the gain parameters for attenuating or intensifying the four bands. The interpolation filter 53 operates to over-sample the output signals of the four multipliers $52_1$ to $52_4$ and then output the signal with the sampling frequency fs. The delaying unit 54 operates to delay the one-bit digital signal with the sampling frequency fs sent from the reproducing circuit 48 by the delay time corresponding to the total processing time of the decimation filter 49, the FIR filters $51_1$ to $51_4$, the multipliers $52_1$ to $52_4$, and the interpolation filter 53. The adder 55 operates to add the output signal of the delaying unit 54 to the output signal of the interpolation filter 53. The sigma-delta modulator 58 operates to sigma-delta modulate the output signal of the adder 55 into the one-bit digital signal with the sampling frequency fs. The D/A converter 59 operates to convert the one-bit digital signal from the modulator 58 into an analog signal.

The FIR filters $51_1$ to $51_4$ and the multipliers $52_1$ to $52_4$ compose a DSP 50.

When a user enters a frequency, a band width, and a gain to be equalized using the operation unit 56, a parameter controller 57 operates to generate the filtering coefficients of the FIR filters $51_1$ to $51_4$ and the gain parameters of the multipliers $52_1$ to $52_4$ based on the input values and rewrite the coefficient memory inside of the DSP 50 for performing a filtering operation.

The output signal from the DSP 50 is over-sampled into the multi-bit signal with the sampling frequency fs (=64×fe) by the interpolation filter 53.

On the other hand, the one-bit digital signal supplied to the delaying unit 54 is delayed by the time corresponding to the total processing time of the decimation filter 49, the FIR filters $51_1$ to $51_4$, the multipliers $52_1$ to $52_4$, and the interpolation filter 53 by the delaying unit 54.

The delayed output of the delaying unit 54 and the filtered output of the interpolation filter 53 are supplied to the adder in which both of the outputs are added.

The added output is supplied from the adder 55 to the sigma-delta modulator 58. The sigma-delta modulator 58 operates to sigma-delta modulate the multi-bit signal with the sampling frequency fs (=64×fe), that is, the added output, into the one-bit digital signal.

The one-bit digital signal is applied to the D/A converter 59 in which the signal is converted into an analog audio signal. The analog audio signal is supplied at an output terminal 60.

The signal reproducing apparatus 45 is also arranged to supply a one-bit digital signal to two systems. In one system, the one-bit digital signal with the sampling frequency 64×fe is down-converted into such a minimum level as enabling to process the audible band components and then only the desired bands of the signal are extracted. The extracted bands are equalized and then the sampling frequency is enhanced to 64×fe. Then, the resulting signal is supplied to the other system in which the signal is added to the information outside of the audible band delayed by a given time.

Hence, this signal reproducing apparatus 45 is arranged to equalize only the audible bands of the one-bit digital signal obtained through the effect of the sigma-delta modulator. This arrangement makes it possible to reduce the necessary hardware in scale and inexpensively manufacture the overall apparatus. That is, the signal reproducing apparatus 45 enables to equalize the one-bit digital signal without losing the information outside of the audible band before reproducing the signal, though the hardware amount is reduced in size.

The signal processing apparatus according to the present invention is arranged to down-sample the input signal having the sampling frequency fs through the effect of a down-sampler, extract the necessary band components from the input signal through the effect of the extracting unit, and perform a predetermined signal treatment with respect to the extracted band components through the effect of the signal processing unit. The band components processed by the signal processing unit is over-sampled to a signal having the sampling frequency fs by the over-sampler. The output of the over-sampler are added to the input signal delayed by the total processing times of the down-sampler, the extracting unit, the signal processing unit, and the over-sampler through the effect of the delaying unit. Hence, this signal processing apparatus enables to perform the adjustment of sound quality such as equalizing with respect to the sigma-delta signal without losing the information outside of the audible band though the hardware amount of the apparatus is reduced in scale.

The signal recording apparatus according to the present invention is arranged to down-sample the input signal having the sampling frequency fs through the effect of the down-sampler, extract the necessary band components from the input signal through the effect of an extracting unit, and perform a predetermined signal treatment with respect to the band components. The treated band components are over-sampled to the signal having the sampling frequency fs through the effect of the over-sampler. The output of the over-sampler is added to the input signal delayed by the total processing time of the down-sampler, the extracting unit, the signal processing unit, and the over-sampler. The added output from the adder is modulated into a sigma-delta signal through the effect of a sigma-delta modulator. The sigma-delta signal is processed by a recording unit and then is recorded on a recording medium. Hence, this signal recording apparatus enables to record a sigma-delta signal that is subject to the adjustment of sound quality such as equalizing without losing the information outside of the audible band though the hardware size of the apparatus is reduced in scale.

The signal reproducing apparatus according to the present invention is arranged to down-sample the input signal having the sampling frequency fs picked out by the pickup unit through the effect of a down-sampler, extract the necessary band components from the input signal through the effect of the extracting unit, and perform a predetermined signal treatment with respect to this band components through the effect of the signal processing unit. The treated band components are over-sampled to the signal having the sampling frequency fs through the effect of the over-sampler. The output of the over-sampler is added to the input signal delayed by the total processing times of the down-sampler, the extracting unit, the signal processing unit, and the over-sampler through the effect of the adder. The added output of the adder is modulated into a sigma-delta signal through the effect of the sigma-delta modulator. Hence, when reproducing the signal, the signal reproducing apparatus enables to perform the adjustment of sound quality such as equalizing with respect to the sigma-delta signal without losing the information outside of the audible band though the hardware size of the apparatus is reduced in scale.

What is claimed is:

1. A signal processing apparatus comprising:
    means for down-sampling an input signal having a sampling frequency fs;
    means for extracting selected band components from an output signal of said means for down-sampling;
    signal processing means for performing a predetermined signal treatment on said selected band components extracted by said means for extracting;
    over-sampling means for over-sampling an output signal from said signal processing means and producing a signal having the sampling frequency fs;
    delaying means for delaying said signal having said sampling frequency fs by a cumulative processing time of said means for down-sampling, said means for extracting, said signal processing means, and said over-sampling means; and
    means for adding an output signal of said delaying means to said signal having the sampling frequency fs produced by said over-sampling means.

2. The signal processing apparatus as claimed in claim 1, further comprising sigma-delta modulating means for sigma-delta modulating an output signal of said means for adding.

3. The signal processing apparatus as claimed in claim 1, wherein said signal processing means includes multiplying means for multiplying said selected band components by a given coefficient.

4. The processing apparatus as claimed in claim 3 further comprising coefficient changing means, wherein said multiplying means multiplies said selected band components by a coefficient changed by said coefficient changing means.

5. The signal processing apparatus as claimed in claim 1, wherein the sampling frequency fs is one of 32 times, 64 times, and 128 times higher than the sampling frequency used for pulse code modulation.

6. A signal recording apparatus comprising:
    means for down-sampling an input signal having a sampling frequency fs;
    means for extracting selected band components from an output signal of said means for down-sampling;
    signal processing means for performing a predetermined signal treatment on said selected band components extracted by said means for extracting;

means for over-sampling an output signal from said signal processing means and producing a signal having said sampling frequency fs;

means for delaying said input signal having said sampling frequency fs by a cumulative processing time of said means for down-sampling, said means for extracting, said signal processing means, and said over-sampling means;

means for adding an output signal of said means for delaying to said signal having said sampling frequency fs produced by said means for over-sampling; and means for sigma-delta modulating an output signal of said means for adding into a one-bit digital signal; and means for recording said one-bit digital signal from said means for sigma-delta modulating.

7. A signal reproducing apparatus comprising:

means for down-sampling an input signal having a sampling frequency fs;

means for extracting selected band components from an output signal of said means for down-sampling;

signal processing means for performing a predetermined signal treatment on said selected band components extracted by said means for extracting;

means for over-sampling an output signal from said signal processing means and producing a signal having said sampling frequency fs;

means for delaying said input signal having said sampling frequency fs by a cumulative processing time of said means for down-sampling, said means for extracting, said signal processing means, and said means for over-sampling;

means for adding an output signal of said means for delaying to said signal having said sampling frequency fs produced by said means for over-sampling;

means for sigma-delta modulating an output signal of said means for adding into a one-bit digital signal; and means for converting said one-bit digital signal from said means for sigma-delta modulating into an analog signal.

* * * * *